(12) United States Patent
Lozhkin

(10) Patent No.: US 9,276,533 B2
(45) Date of Patent: Mar. 1, 2016

(54) DISTORTION COMPENSATION APPARATUS AND METHOD

(71) Applicant: FUJITSU LIMITED, Kawasaki-shi, Kanagawa (JP)

(72) Inventor: Alexander Nikolaevich Lozhkin, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 98 days.

(21) Appl. No.: 14/248,680

(22) Filed: Apr. 9, 2014

(65) Prior Publication Data

US 2015/0028947 A1     Jan. 29, 2015

(30) Foreign Application Priority Data

Jul. 26, 2013  (JP) ................. 2013-155130

(51) Int. Cl.
| | | |
|---|---|---|
| H03F 3/189 | (2006.01) | |
| H03F 1/32 | (2006.01) | |
| H03F 3/24 | (2006.01) | |
| H03G 3/30 | (2006.01) | |

(52) U.S. Cl.
CPC ............. *H03F 3/189* (2013.01); *H03F 1/3247* (2013.01); *H03F 1/3258* (2013.01); *H03F 3/245* (2013.01); *H03G 3/3042* (2013.01); *H03F 2200/451* (2013.01); *H03F 2201/3227* (2013.01); *H03F 2201/3233* (2013.01)

(58) Field of Classification Search
CPC ..................................................... H03F 1/3241
USPC ................................................ 330/149, 151
See application file for complete search history.

(56) References Cited

U.S. PATENT DOCUMENTS

| | | | | | |
|---|---|---|---|---|---|
| 5,193,224 | A * | 3/1993 | McNicol | .................. | H03C 3/08 330/149 |
| 5,760,646 | A * | 6/1998 | Belcher | ................. | H03F 1/3229 330/149 |
| 6,600,792 | B2 * | 7/2003 | Antonio | ................ | H03F 1/3241 330/149 |
| 6,744,315 | B2 * | 6/2004 | Ezuka | ................... | H03F 1/3294 330/149 |
| 8,611,459 | B2 * | 12/2013 | McCallister | ...... | H04L 25/03343 330/149 |
| 2010/0304694 | A1 | 12/2010 | Suzuki et al. | | |

FOREIGN PATENT DOCUMENTS

| | | |
|---|---|---|
| JP | 05-268117 | 10/1993 |
| JP | 09-016686 | 1/1997 |
| JP | 2002-232328 | 8/2002 |
| JP | 2005-012419 | 1/2005 |
| JP | 2010-103834 | 5/2010 |
| JP | 2010-154017 | 7/2010 |
| JP | 2010-278505 | 12/2010 |
| WO | 97/00488 | 1/1997 |
| WO | 2009/016686 | 2/2009 |

\* cited by examiner

*Primary Examiner* — Henry Choe
(74) *Attorney, Agent, or Firm* — Fujitsu Patent Center

(57) ABSTRACT

A distortion compensation apparatus compensates for nonlinear distortion of a power amplifier. The distortion compensation apparatus includes a pre-distorter, a learning unit, and a gain control unit. During training of the pre-distorter, the learning unit repeatedly updates a compensation coefficient on the basis of signals output from the power amplifier. While the training continues after update of the compensation coefficient, the gain control unit performs gain control on a signal before input to the power amplifier.

6 Claims, 13 Drawing Sheets

DISTORTION COMPENSATION APPARATUS AND METHOD

CROSS-REFERENCE TO RELATED APPLICATION

This application is based upon and claims the benefit of priority of the prior Japanese Patent Application No. 2013-155130, filed on Jul. 26, 2013, the entire contents of which are incorporated herein by reference.

FIELD

The embodiments discussed herein are related to a distortion compensation apparatus and a distortion compensation method.

BACKGROUND

In a radio communication system, a radio transmitting apparatus for transmitting radio signals uses a power amplifier so as to amplify transmission signals. In a region where the amplitude of the input signal is small, the power amplifier has a linear characteristic such that the amplitude of the input signal and the amplitude of the output signal have a substantially linear relationship. On the other hand, in a region where the amplitude of the input signal is large, the power amplifier has a non-linear characteristic such that the amplitude of the input signal and the amplitude of the output signal have a non-linear relationship. In many cases, in order to use the power amplifier effectively, the power amplifier is operated not only in the linear region, but also in the non-linear region.

However, non-linear distortion of a transmission signal due to the non-linear amplification characteristic of the power amplifier may cause a reduction in the radio communication quality, such as power leakage from the desired frequency band to the adjacent frequency bands and the like. As one method for linearizing the non-linear amplification characteristic of the power amplifier, the radio transmitting apparatus performs distortion compensation using a pre-distortion scheme. For performing distortion compensation using the pre-distortion scheme, the radio transmitting apparatus is provided with a pre-distorter that serves as a linearizer.

The pre-distorter applies non-linear distortion having a characteristic opposite to the non-linear characteristic of the power amplifier to a transmission signal before input to the power amplifier. Then, the transmission signal to which the non-linear distortion having the opposite characteristic is applied passes through the power amplifier. Thus, it is possible to prevent the amplified transmission signal from being non-linearly distorted with respect to the transmission signal before input to the pre-distorter. For example, the pre-distorter applies to the transmission signal to be input to the power amplifier a compensation coefficient corresponding to the amplitude of the transmission signal (for example, multiplies the transmission signal by the compensation coefficient) such that the amplitude of the transmission signal becomes non-linear. The compensation coefficient corresponding to the amplitude of the transmission signal may be stored in a lookup table, for example.

However, it is not easy to accurately estimate the characteristic opposite to the non-linear characteristic of the power amplifier in advance. Therefore, in the distortion compensation system using the pre-distortion scheme, the compensation coefficient used by the pre-distorter is adaptively updated while operating the power amplifier. For example, the radio transmitting apparatus feeds back the output signal of the power amplifier. Then, an appropriate compensation coefficient is estimated on the basis of a feedback signal and a transmission signal before input to the power amplifier, and is set in the pre-distorter.

It is to be noted that there has been proposed a transmitter that includes an intermediate frequency amplifier upstream of a distortion compensation circuit. On the basis of a detected intermediate frequency signal before input to the distortion compensation circuit, the input signals to the distortion compensation circuit are controlled to be maintained at a constant level. There has also been proposed a radio communication apparatus for a radio communication system that includes an automatic gain controller upstream of a non-linear phase distortion compensator. The gain of a high-frequency signal to be input to the non-linear phase distortion compensator is controlled in accordance with an external signal. There has also been proposed an amplifying apparatus in which a variable attenuator is provided upstream of a pre-distortion circuit, and in which a power detector for detecting power leaked to the adjacent channels is provided downstream of an amplifier. This amplifying apparatus controls the attenuation amount of the variable attenuator on the basis of the leaked power.

Further, there has been proposed a distortion compensation apparatus in which a variable attenuator is provided between a multiplier for multiplying a baseband signal by a distortion compensation coefficient and a power amplifier. This distortion compensation apparatus controls the gain of the variable attenuator in accordance with the temperature and the frequency of an analog circuit. There has also been proposed a distortion compensation apparatus in which an attenuation circuit is provided between a distortion compensator and an amplifier circuit, and in which a detection circuit for detecting an output power of the amplifier circuit is provided downstream of the amplifier. This distortion compensation apparatus adjusts the attenuation amount of the attenuation circuit in accordance with the output power from the amplifier circuit. There has also been proposed a transmission amplifier that includes a power adjustment unit upstream of a non-linear distortion compensation unit. This transmission amplifier controls the gain of a symbol to be input to the non-linear distortion compensation unit on the basis of the average power of the symbol before input to the non-linear distortion compensation unit. There has also been proposed a radio transmitting apparatus that includes a gain adjustment unit in a distortion compensation unit. The gain adjustment unit corrects a distortion compensation coefficient in accordance with a power value of a feedback signal from a power amplifier.

These proposed techniques are disclosed, for example, in the following references: Japanese Laid-open Patent Publication No. 5-268117; Japanese Laid-open Patent Publication No. 2002-232328; Japanese Laid-open Patent Publication No. 2005-12419; International Publication Pamphlet No. WO2009/016686; Japanese Laid-open Patent Publication No. 2010-103834; Japanese Laid-open Patent Publication No. 2010-154017; and Japanese Laid-open Patent Publication No. 2010-278505.

The non-linear amplification characteristic of the power amplifier is not always constant, but varies with changes in temperature and the like, depending on the driving conditions of the power amplifier. Accordingly, when the average power of inputs to the power amplifier changes, the amplification characteristic of the power amplifier changes slightly. That is, the amplitude of an output signal after amplification corresponding to the amplitude of an input signal is dependent on the average power of input signals around that input signal.

Such variation in the amplification characteristic of the power amplifier affects the training of the pre-distorter as described below.

It is assumed that, during the training, the compensation coefficient of the pre-distorter is repeatedly updated on the basis of feedback signals from the power amplifier. In this case, the updated compensation coefficient is calculated so as to match the amplification characteristic of the power amplifier before the update. However, when the compensation coefficient is updated, even when the average power of inputs to the pre-distorter remains the same, the average power of the outputs from the pre-distorter is changed from the average power before the update, so that the average power of the inputs to the power amplifier changes. Thus, the driving conditions of the power amplifier change, so that the amplification characteristic changes slightly. In the case where the training continues, the compensation coefficient is further updated so as to match the changed amplification characteristic of the power amplifier. Thus, the convergence of the compensation coefficient is delayed.

SUMMARY

According to one aspect of the invention, there is provided a distortion compensation apparatus that compensates for non-linear distortion of a power amplifier. This distortion compensation apparatus includes a pre-distorter configured to apply distortion to a signal before input to the power amplifier, in accordance with a compensation coefficient; a learning unit configured to repeatedly update the compensation coefficient on the basis of signals output from the power amplifier, during training of the pre-distorter; and a gain control unit configured to perform gain control on a signal before input to the power amplifier, while the training continues after update of the compensation coefficient.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
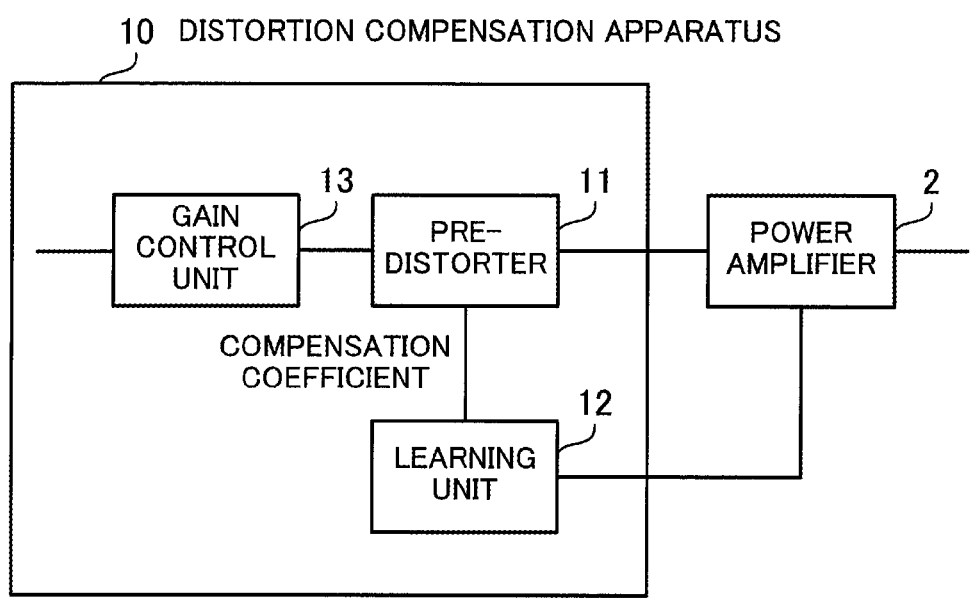
FIG. 1 illustrates a distortion compensation apparatus according to a first embodiment.

Several embodiments will be described below with reference to the accompanying drawings, wherein like reference numerals refer to like elements throughout.

Embodiments of the present invention will be explained below with reference to the accompanying drawings.

(a) First Embodiment

FIG. 1 illustrates a distortion compensation apparatus 10 according to a first embodiment.

The distortion compensation apparatus 10 of the first embodiment compensates for non-linear distortion of a power amplifier 2. The non-linear distortion is produced in the signal output from the power amplifier 2 due to a non-linear relationship between the amplitude of the input and the amplitude of the output (amplification characteristic) of the power amplifier 2. The power amplifier 2 may be a high power amplifier. The power amplifier 2 and the distortion compensation apparatus 10 are mounted, for example, in a radio transmitting apparatus that transmits radio signals. Examples of radio transmitting apparatuses include radio base stations, radio relay stations, and radio terminal apparatuses.

The distortion compensation apparatus 10 includes a pre-distorter 11, a learning unit 12, and a gain control unit 13.

The pre-distorter 11 applies distortion to a signal before input to the power amplifier 2, in accordance with a compensation coefficient. The distortion applied by the pre-distorter 11 preferably has a characteristic opposite to the non-linear characteristic of the power amplifier 2, and cancels non-linear distortion generated in the power amplifier 2. The compensation coefficient used by the pre-distorter 11 is calculated through training, as will be described below. For example, the pre-distorter 11 obtains a compensation coefficient corresponding to the amplitude of an input signal from a lookup table in which a plurality of amplitudes are associated with a plurality of compensation coefficients, and applies the compensation coefficient to the input signal (for example, multiplies the input signal by the compensation coefficient).

During the training of the pre-distorter 11, the learning unit 12 repeatedly updates the compensation coefficient on the basis of signals output from the power amplifier 2 so as to improve the accuracy of the compensation coefficient. The longer the training period is, the higher the accuracy of pre-distortion becomes. During the training, when the learning unit 12 updates the compensation coefficient, the pre-distorter 11 performs distortion compensation using the updated compensation coefficient. Then, the power amplifier 2 amplifies a signal that is distorted in accordance with the updated compensation coefficient. In the case where the training continues, the learning unit 12 obtains from the power amplifier 2 a feedback signal after update of the compensation coefficient, and further updates the compensation coefficient on the basis of the feedback signal.

Examples of learning architectures of the learning unit 12 include a direct learning architecture and an indirect learning architecture. With the direct learning architecture, the learning unit 12 compares the signal before input to the pre-distorter 11 and the feedback signal from the power amplifier 2, and updates the compensation coefficient so as to reduce the difference between the amplitudes of the two signals, for example. With the indirect learning architecture, the learning unit 12 compensates for distortion of the feedback signal from the power amplifier 2 such that the amplitude of the feedback signal becomes close to the amplitude of the signal that has passed through the pre-distorter 11 and is to be input to the power amplifier 2, for example. In this case, the learning unit 12 may be considered to be provided with a post-distorter. The learning unit 12 copies the compensation coefficient learned by the distortion compensation of the feedback signal to the pre-distorter 11.

While the training continues after update of the compensation coefficient of the pre-distorter 11, the gain control unit 13 performs gain control on a signal before input to the power amplifier 2. For example, after update of the compensation coefficient, the gain control unit 13 calculates the average power of signals that have passed through the pre-distorter 11, and performs gain control in accordance with the calculated average power. The average power may be calculated for signals that have passed through the pre-distorter 11 and are to be input to the power amplifier 2, or may be calculated for signals that have passed through the power amplifier 2. For example, the gain control unit 13 performs gain control on a signal before input to the pre-distorter 11, for example.

The gain control unit 13 performs gain control by, for example, reducing the gain when the average power is increased by the update of the compensation coefficient, and increasing the gain when the average power is reduced by the update of the compensation coefficient. Further, the gain control unit 13 performs gain control by correcting the amplitude of the signal such that the average power approaches a predetermined reference average power. The gain control unit 13 may amplify or attenuate the amplitude of the input signal by a factor corresponding to the average power.

In the case where gain control is not performed by the gain control unit 13, when the compensation coefficient of the pre-distorter 11 is updated by the learning unit 12, the average power of signals that have passed through the pre-distorter 11 and are input to the power amplifier 2 is changed from the average power before the update of the compensation coefficient. Thus, the driving conditions of the power amplifier 2 change, so that the amplification characteristic of the power amplifier 2 changes. As a result, the convergence of the compensation coefficient that is repeatedly updated by the learning unit 12 might be delayed.

On the other hand, in the distortion compensation apparatus 10 of the first embodiment, gain control is performed on a signal before input to the power amplifier 2 (for example, a signal to be input to the pre-distorter 11) during the training, which repeatedly updates the compensation coefficient. Thus, even when the compensation coefficient is updated, it is possible to prevent the average power of signals input to the power amplifier 2 from changing. Therefore, it is possible to prevent the amplification characteristic of the power amplifier 2 from changing (prevent outputs signal from having different amplitudes although input signals have the same amplitude), which allows the learning unit 12 to stably learn the compensation coefficient. As a result, the compensation coefficient converges more quickly, which makes it possible to calculate an accurate compensation coefficient in less training time.

(b) Second Embodiment

Figure 2:
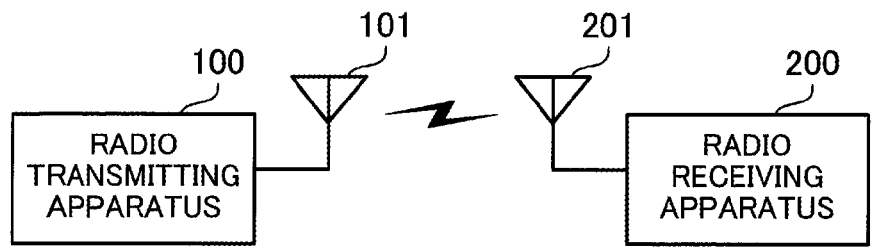
FIG. 2 illustrates a radio communication system according to a second embodiment.

FIG. 2 illustrates a radio communication system according to a second embodiment.

The radio communication system according to the second embodiment includes a radio transmitting apparatus 100 and a radio receiving apparatus 200. The radio transmitting apparatus 100 includes an antenna 101, and is configured to transmit a radio signal to the radio receiving apparatus 200 through the antenna 101. The radio receiving apparatus 200 includes an antenna 201, and is configured to receive the radio signal from the radio transmitting apparatus 100 through the antenna 201.

In the second embodiment, transmission processing by the radio transmitting apparatus 100 will be described. However, a radio communication apparatus serving as the radio transmitting apparatus 100 may further perform reception processing. Similarly, a radio communication apparatus serving as the radio receiving apparatus 200 may further perform transmission processing. Further, this radio communication system may be a one-to-many connection system in which a radio base station communicates with a plurality of radio terminal apparatuses. In this case, for example, the radio transmitting apparatus 100 may serve as a radio base station, and the radio receiving apparatus 200 may serve as a radio terminal apparatus. Alternatively, for example, the radio transmitting apparatus 100 may serve as a radio terminal apparatus, and the radio receiving apparatus 200 may serve as a radio base station. Further alternatively, at least one of the radio transmitting apparatus 100 and the radio receiving apparatus 200 may serve as a radio relay apparatus.

Figure 3:
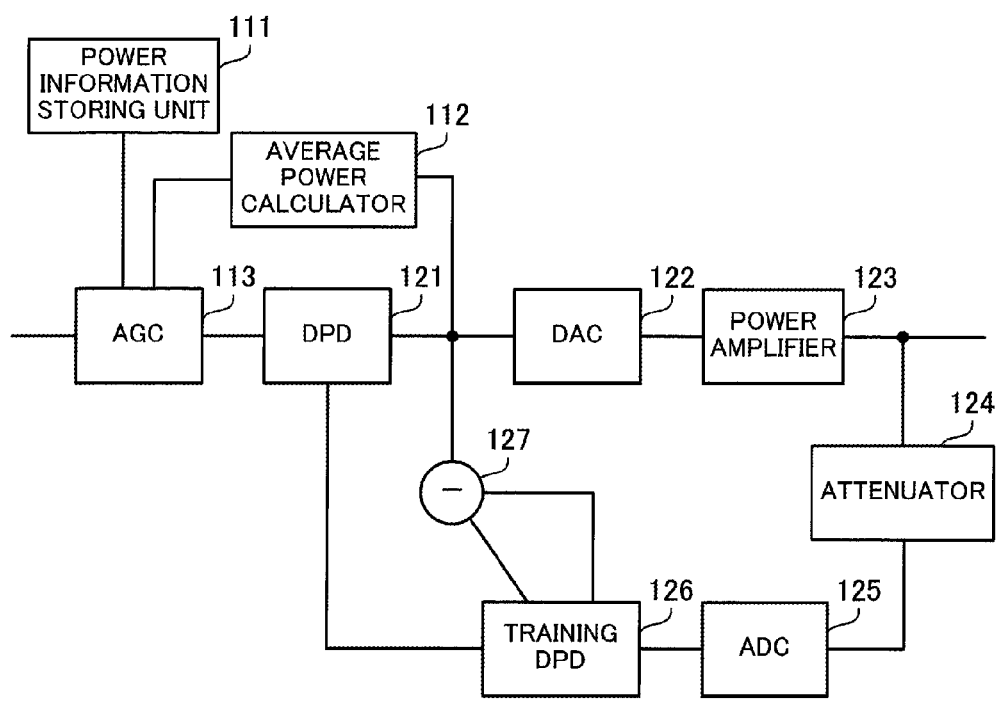
FIG. 3 is a block diagram illustrating a radio transmitting apparatus according to the second embodiment.

FIG. 3 is a block diagram illustrating the radio transmitting apparatus 100 according to the second embodiment.

The radio transmitting apparatus 100 includes a power information storing unit 111, an average power calculator 112, an automatic gain controller (AGC) 113, a digital pre-distorter (DPD) 121, a digital-analog converter (DAC) 122, a power amplifier 123, an attenuator 124, an analog-digital converter (ADC) 125, a training DPD 126, and a subtractor 127. The power amplifier 123 is an example of the power amplifier 2 of the first embodiment. The DPD 121 is an example of the pre-distorter 11. A group of the training DPD 126 and the subtractor 127 is an example of the learning unit 12. A group of the power information storing unit 111, the average power calculator 112, and the AGC 113 is an example of the gain control unit 13.

The power information storing unit 111 stores information indicating a reference average power used for gain control (described below). The power information storing unit 111 may be a volatile semiconductor memory or a non-volatile semiconductor memory. The reference average power may be fixed in advance, or may be calculated by the radio transmitting apparatus 100 according to the communication conditions. For example, the radio transmitting apparatus 100 may determine the reference average power at the beginning of training of the DPD 121 (described below).

The average power calculator 112 continuously calculates the average power of signals that are output from the DPD 121 and are to be input to the DAC 122. This average power is the average power of the latest M (M is an integer equal to 2 or greater) signals, and therefore is a moving average. For calculating the average power, the average power calculator 112 may use a sliding window scheme. For example, the average power calculator 112 temporarily stores the latest M signals output from the DPD 121, and calculates the average power of the M signals stored in the memory.

The AGC 113 performs gain control on a sample signal to be input to the DPD 121, during the training of the DPD 121. More specifically, the AGC 113 compares the average power calculated by the average power calculator 112 with the reference average power indicated by the information stored in the power information storing unit 111. Then, the AGC 113 controls the amplitude of each input sample signal such that the average power approaches the reference average power.

That is, upon detection of a difference between the average power and the reference average power, the AGC 113 changes the amplitude multiplication factor to be applied to the sample signal. Thus, the signal input to the DPD 121 has amplitude of real number times the amplitude of the original sample signal.

The DPD 121 is a pre-distorter that performs digital distortion compensation on a signal to be transmitted to the radio receiving apparatus 200. The DPD 121 has a set of compensation coefficients used for distortion compensation. For example, the DPD 121 selects a compensation coefficient corresponding to the amplitude of the input signal, and multiplies the signal by the selected compensation coefficient. A set of compensation coefficients may be stored in a lookup table in which a compensation coefficient is uniquely identified by the amplitude of the signal, for example.

This set of compensation coefficients is preferably for providing a characteristic opposite to the non-linear characteristic of the power amplifier 123, and is for canceling non-linear distortion generated in the power amplifier 123. The set of compensation coefficients is determined through the training of the DPD 121. During the training, in each operation of learning a set of compensation coefficients, N (N is an integer greater than M) sample signals having a predetermined length are input to the DPD 121. During the training, the DPD 121 compensates for distortion of the sample signals in the same manner as in the case of communicating with the radio receiving apparatus 200 by radio.

Every time a learning operation using N sample signals is performed, a set of compensation coefficients calculated by the training DPD 126 (described below) is copied to the DPD 121. Then, the DPD 121 compensates for distortion of subsequent N sample signals, using the updated set of compensation coefficients. In this way, during the training, the operation of learning using N sample signals is repeatedly performed, so that the set of compensation coefficients is repeatedly updated. The greater the number of times the learning operation is repeated is, the higher the accuracy of the compensation coefficient becomes. Note that, in the first learning operation, the DPD 121 may use an initial value as the compensation coefficient. The initial value of the compensation coefficient may be a value that does not correct the sample signal.

The number N of sample signals used in one learning operation may correspond to a duration of one radio frame (for example, corresponds to a duration of 10 ms). The greater the number of sample signals used in one learning operation is, the higher the learning accuracy becomes. The sample signals may be signals that are randomly generated. In this case, although different sets of sample signals are used in different learning operations, their average powers are expected to be substantially the same due to the randomness.

The DAC 122 converts the digital signal distorted by the DPD 121 into an analog signal, and outputs the analog signal to the power amplifier 123. During the training, the DAC 122 converts a digital signal based on a sample signal into an analog signal.

The power amplifier 123 amplifies the analog signal output from the DAC 122. The power amplifier 123 may be a high power amplifier (HPA). When the radio transmitting apparatus 100 communicates with the radio receiving apparatus 200 by radio, a transmission signal amplified by the power amplifier 123 is transmitted from the antenna 101. During the training, the power amplifier 123 amplifies an analog signal based on a sample signal. The power amplifier 123 has a non-linear amplification characteristic such that the amplitude of an input signal and the amplitude of an output signal have a non-linear relationship. Therefore, in the case where distortion compensation is not performed by the DPD 121, the amplified signal is non-linearly distorted.

The attenuator 124 attenuates the signal output from the power amplifier 123, and outputs the attenuated signal to the ADC 125, during the training. The signal input to the ADC 125 has an amplitude of real number times the amplitude of the signal output from the power amplifier 123. The attenuation rate of the attenuator 124 may be fixed in advance. For example, the amplitude multiplication factor of the attenuator 124 may be the reciprocal of the ideal amplification factor that is applied when the amplification characteristic of the power amplifier 123 is linearized.

The ADC 125 converts the analog signal attenuated by the attenuator 124 into a digital signal, and outputs the digital signal to the training DPD 126. Note that a signal fed back from the power amplifier 123 to the training DPD 126 through the attenuator 124 and the ADC 125 may be considered as a feedback signal. Further, a group of the attenuator 124 and the ADC 125 may be considered as a feedback circuit. The feedback circuit may be operated only during the training of the DPD 121.

The training DPD 126 learns a set of compensation coefficients by performing pre-distortion similar to that performed by the DPD 121, during the training. The training DPD 126 may be considered to serve as a post-distorter. More specifically, when starting a learning operation using N sample signals, the training DPD 126 has the same set of compensation coefficients as the DPD 121. This set of compensation coefficients may be stored in a lookup table in which a compensation coefficient is uniquely identified by the amplitude, for example.

During one learning operation, the training DPD 126 performs digital distortion compensation on a signal obtained from the ADC 125, and outputs the resulting signal to the subtractor 127. For example, the training DPD 126 selects a compensation coefficient corresponding to the amplitude of the signal obtained from the ADC 125, and multiplies the signal by the selected compensation coefficient. Then, the training DPD 126 obtains information indicating the error of the signal after distortion compensation from the subtractor 127. Then, the training DPD 126 updates the set of compensation coefficients held by the training DPD 126, on the basis of the error.

For example, the training DPD 126 calculates the root mean square (RMS) of the error of each signal, and updates the compensation coefficients held by the training DPD 126 so as to minimize the total error in accordance with a least mean square (LMS) algorithm. Then, upon completion of one learning operation using N sample signals, the set of compensation coefficients held by the training DPD 126 is copied to the DPD 121. During the training, such operation of learning a set of compensation coefficients is repeatedly performed. The number of times the learning operation is repeated may be fixed in advance, or may be adaptively determined in accordance with the error calculated by the subtractor 127. The above-described learning method is often called an indirect learning architecture.

The subtractor 127 compares the signal that is output from the DPD 121 and is to be input to the DAC 122 and the signal that is output from the training DPD 126, and calculates the difference between the two signals, during the training. The subtractor 127 reports to the training DPD 126 the calculated difference as a linearization error. For absorbing the difference between the obtaining timings of the two signals to be compared, a buffer for temporarily storing signals may be provided between the DPD 121 and the subtractor 127. Note that the training DPD 126 and the subtractor 127 may be operated only during the training.

Next, a description will be given of the amplification characteristic of the power amplifier 123 and the role of the AGC 113.

Figure 4:
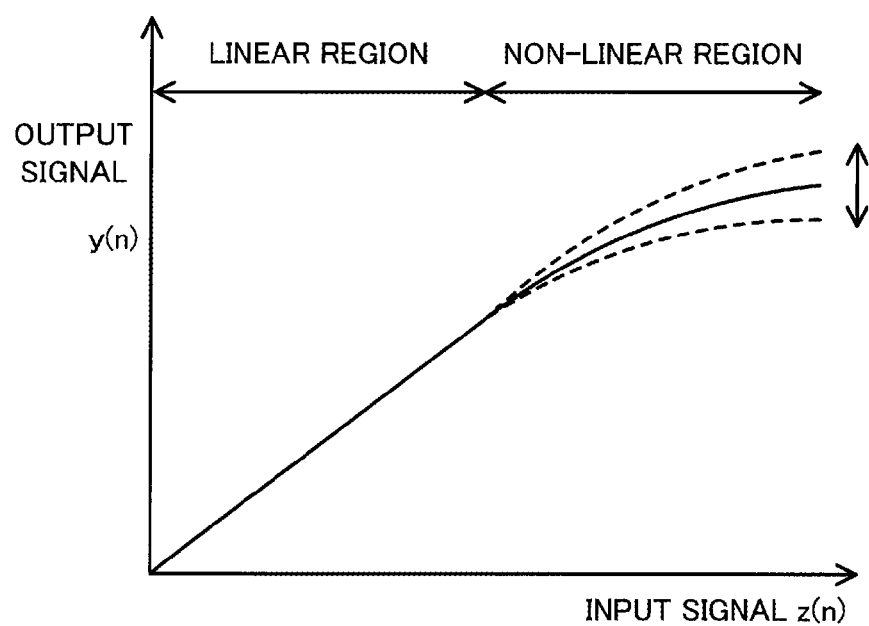
FIG. 4 is a graph illustrating an exemplary amplification characteristic of a power amplifier.

FIG. 4 is a graph illustrating an exemplary amplification characteristic of the power amplifier 123.

The power amplifier 123 has a substantially linear amplification characteristic in a region where the amplitude of the input signal is small (linear region). That is, when the amplitude of the input signal is small, the amplification factor is substantially constant, so that the amplitude of the input signal and the amplitude of the output signal have a linear relationship. On the other hand, in a region where the amplitude of the input signal is large, the power amplifier 123 has a non-linear amplification characteristic (non-linear region). That is, when the amplitude of the input signal is large, the amplification factor does not remain constant and varies with the amplitude of the input signal, so that the amplitude of the input signal and the amplitude of the output signal have a non-linear relationship. Usually, in the non-linear region, the amplification factor is less than in the linear region, and decreases as the amplitude of the input signal increases. In order to amplify the signal effectively, the input signal in the non-linear region is also input to the power amplifier 123.

The amplification characteristic of the power amplifier 123 is not always constant, but varies with changes in temperature and the like, depending on the driving conditions thereof. Accordingly, when the average power of the input signals changes, the amplification characteristic of the power amplifier 123 also changes. In the graph of FIG. 4, the curve varies with the average power of the input signals. Therefore, if the average power of input signals input to the power amplifier 123 vary between the first and second learning operations, the amplification characteristic of the power amplifier 123 vary between the first and second learning operations. Such a change in the amplification characteristic increases the error detected by the subtractor 127, which might result in a delay in convergence of the compensation coefficient.

Figure 5:
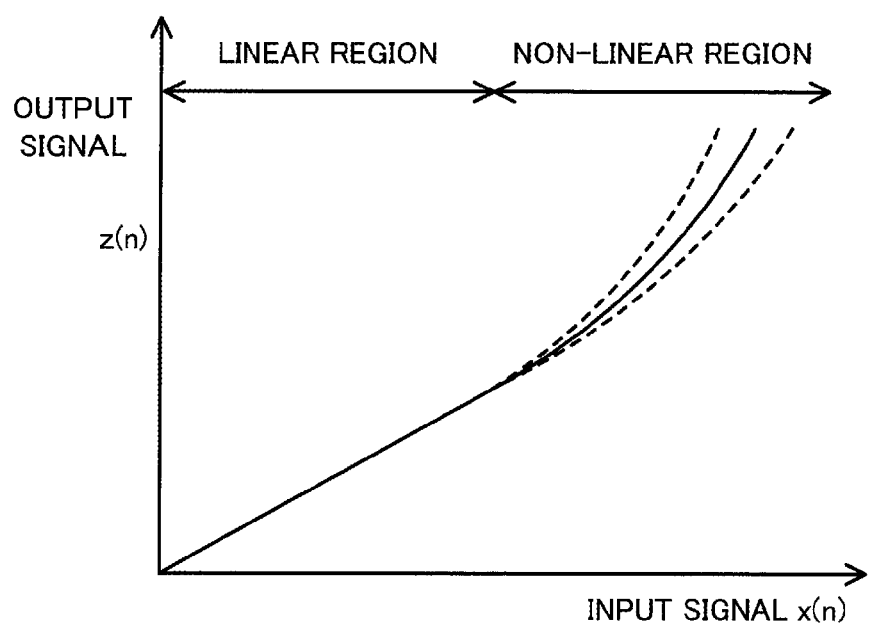
FIG. 5 is a graph illustrating an example of distortion compensation by a pre-distorter.

FIG. 5 is a graph illustrating an example of distortion compensation by a pre-distorter.

The DPD 121 preferably applies distortion to the input signal so as to linearize the amplification characteristic of the power amplifier 123 by cancelling the non-linearity thereof. Similar to the power amplifier 123, the DPD 121 has a linear gain characteristic in a region where the amplitude of the input signal is small (linear region). In the linear region, the amplitude of the output signal is not greatly changed from the amplitude of the input signal. On the other hand, in a region where the amplitude of the input signal is large, the DPD 121 has a non-linear gain characteristic in accordance with the non-linearity of the amplification factor of the power amplifier 123 (non-linear region). In the non-linear region, contrary to the case of the power amplifier 123, the gain is greater than in the linear region, and the amplitude multiplication factor increases as the amplitude of the input signal increases.

Accordingly, in the case where the DPD 121 performs distortion compensation, the average power of signals input to the power amplifier 123 becomes greater than in the case where distortion compensation is not performed. Further, when the set of compensation coefficients of the DPD 121 is updated, even when the average power of signals input to the DPD 121 remains the same, the average power of signals output from the DPD 121 changes, so that the average power of signals input to the power amplifier 123 changes. As a result, while the learning of the set of compensation coefficients is repeated, the optimum gain characteristic of the DPD 121 varies with changes in the amplification characteristic of the power amplifier 123. In the graph of FIG. 5, the curve varies while the learning of the set of compensation coefficients is repeated.

In the second embodiment, the AGC 113 is used so as to prevent the average power of signals input to the power amplifier 123 from changing even when the set of compensation coefficients is repeatedly updated during the training. This allows the training DPD 126 to stably learn a set of compensation coefficients, and thus allows the set of compensation coefficients to converge more quickly.

Next, a description will be given of the flow of signals in the radio transmitting apparatus 100.

Figure 6:
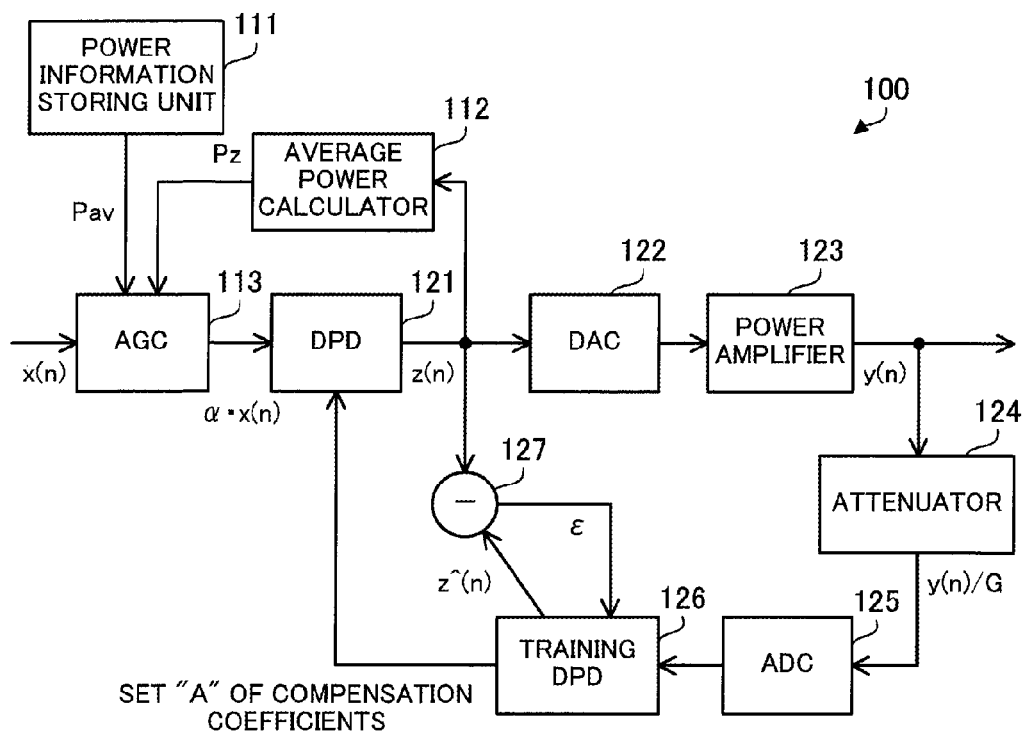
FIG. 6 illustrates the flow of signals in the radio transmitting apparatus.

FIG. 6 illustrates the flow of signals in the radio transmitting apparatus 100.

In each operation of learning a set of compensation coefficients, signals $x(n)$ ($n$ is an integer from 1 to N) as N sample signals are input to the AGC 113. The signals $x(n)$ may be randomly generated for each operation of learning a set of compensation coefficients. The AGC 113 multiplies the signal $x(n)$ by a factor $\alpha$, and outputs a signal $\alpha \cdot x(n)$. The initial value of the factor $\alpha$ is 1. When the input of N sample signals starts, the AGC 113 compares an average power Pz as a moving average calculated by the average power calculator 112 with a reference average power Pav indicated by the information stored in the power information storing unit 111, and adjusts the factor $\alpha$ such that the average power Pz approaches the reference average power Pav. The factor $\alpha$ is adjusted until the difference between the average power Pz and the reference average power Pav becomes equal to a threshold or less.

The DPD 121 applies a compensation coefficient to the signal $\alpha \cdot x(n)$, and outputs a signal $z(n)$. The signal $z(n)$ is input to the average power calculator 112, the DAC 122, and the subtractor 127. The average power calculator 112 calculates an average power Pz of the latest M signals $z(n)$. The average power Pz may be defined by: $Pz = 1/M \cdot Sum\{z(n) \cdot z^*(n)\} = Sum\{PD(\alpha \cdot x(n) \cdot \alpha \cdot x^*(n))\}$, where $z^*(n)$ is the complex conjugate of $z(n)$; $x^*(n)$ is the complex conjugate of $x(n)$; and $PD(\ldots)$ is a function representing the output of the DPD 121.

The power amplifier 123 amplifies the signal $z(n)$, which has been converted into an analog signal by the DAC 122, and outputs a signal $y(n)$. An amplification factor G is an ideal amplification factor that is applied when the amplification characteristic of the power amplifier 123 is linearized. The attenuator 124 attenuates the amplitude of the signal $y(n)$ output from the power amplifier 123 to $1/G$, and outputs a signal $y(n)/G$. The signal $y(n)/G$ is converted into a digital signal by the ADC 125, and then is input to the training DPD 126.

The training DPD 126 applies a compensation coefficient to the signal $y(n)/G$, and outputs a signal $\hat{z}(n)$. A set A of compensation coefficients held by the training DPD 126 at the beginning of input of the N sample signals is the same as that held by the DPD 121. The subtractor 127 calculates an error $\epsilon$ by subtracting the signal $\hat{z}(n)$ output by the training DPD 126 from the signal $z(n)$ output by the DPD 121. The training DPD 126 updates the set A of compensation coefficients on the basis of the errors $\epsilon$ calculated for the N sample signals, in accordance with the LMS algorithm. Then, upon completion of processing on the N sample signals, the training DPD 126 copies the updated set A of compensation coefficients to the DPD 121.

In the following, a description will be given of the first operation of learning the set A of compensation coefficients in which distortion compensation is not virtually performed by the DPD 121. It is assumed that the factor of the AGC 113 is α=1. In this case, z(n)=x(n). If the amplitude of the signal z(n) is in the non-linear region of the amplification characteristic of the power amplifier 123, the amplification factor for the signal z(n) is less than G, and thus y(n)<G·x(n). Accordingly, $\hat{z}$(n)=y(n)/G<x(n), and thus z(n)<$\hat{z}$(n). Thus, there is a positive error ε, and therefore the training DPD 126 updates the set A of compensation coefficients such that the compensation coefficient corresponding to the non-liner region is increased.

Next, a description will be given of the case where an ideal set A of compensation coefficients is set in the DPD 121. In this case, z(n)=a·x(n) in which "a" is a compensation coefficient corresponding to the signal z(n). Since the amplification characteristic of the power amplifier 123 is ideally linearized, y(n)=G·x(n). Accordingly, $\hat{z}$(n)=a·y(n)/G=a·x(n), and therefore z(n)=$\hat{z}$(n). Thus, the error ε is zero, and therefore the training DPD 126 maintains the current set A of compensation coefficients. The learning of the set A of compensation coefficients is performed repeatedly, starting with a situation in which distortion compensation is not performed. Thus, the set A of compensation coefficients approaches to the ideal one.

Next, a description will be given of implementation examples of the AGC 113.

Figure 7A:
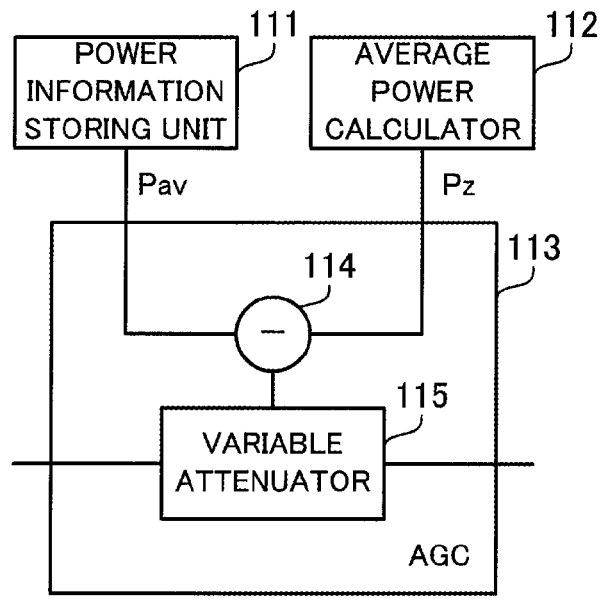
FIGS. 7A and 7B are block diagrams each illustrating an implementation example of an automatic gain controller.
Figure 7B:
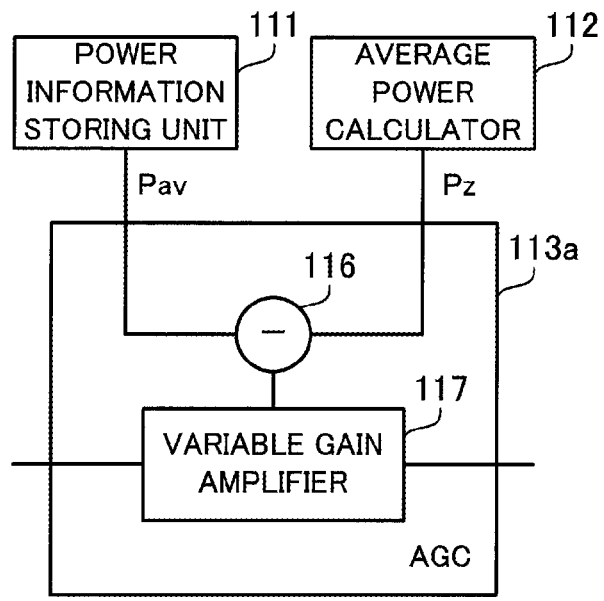

FIGS. 7A and 7B are block diagrams each illustrating an implementation example of the AGC 113.

The AGC 113 includes a subtractor 114 and a variable attenuator 115. The subtractor 114 subtracts the reference average power Pav from the average power Pz. The variable attenuator 115 achieves a gain of the factor α by adjusting the attenuation rate. In the case where the threshold is Th>0, when the average power Pz is sufficiently greater than the reference average power Pav (when Pz−Pav>Th), the variable attenuator 115 reduces the factor α by increasing the attenuation rate. On the other hand, when the average power Pz is sufficiently less than the reference average power Pav (when Pz−Pav<−Th), the variable attenuator 115 increases the factor α by reducing the attenuation rate. After the average power Pz becomes substantially equal to the reference average power Pav (−Th≤Pz−Pav≤Th), the current factor α may be maintained.

The gain control of the AGC 113 may be realized by other methods. For example, an AGC 113a illustrated in FIG. 7B may be used in place of the AGC 113.

The AGC 113a includes a subtractor 116 and a variable gain amplifier 117. The subtractor 116 subtracts the average power Pz from the reference average power Pav. The variable gain amplifier 117 achieves a gain of the factor α by adjusting the amplification factor. When the reference average power Pav is sufficiently greater than the average power Pz (when Pav−Pz>Th), the variable gain amplifier 117 increases the factor α by increasing the amplification factor. On the other hand, when the reference average power Pav is sufficiently less than the average power Pz (when Pav−Pz<−Th), the variable gain amplifier 117 reduces the factor α by reducing the amplification factor. After the average power Pz becomes substantially equal to the reference average power Pav (−Th≤Pav−Pz≤Th), the current factor α may be maintained.

Next, a description will be given of an example of training procedure, especially the procedure of gain control of the AGC 113.

Figure 8:
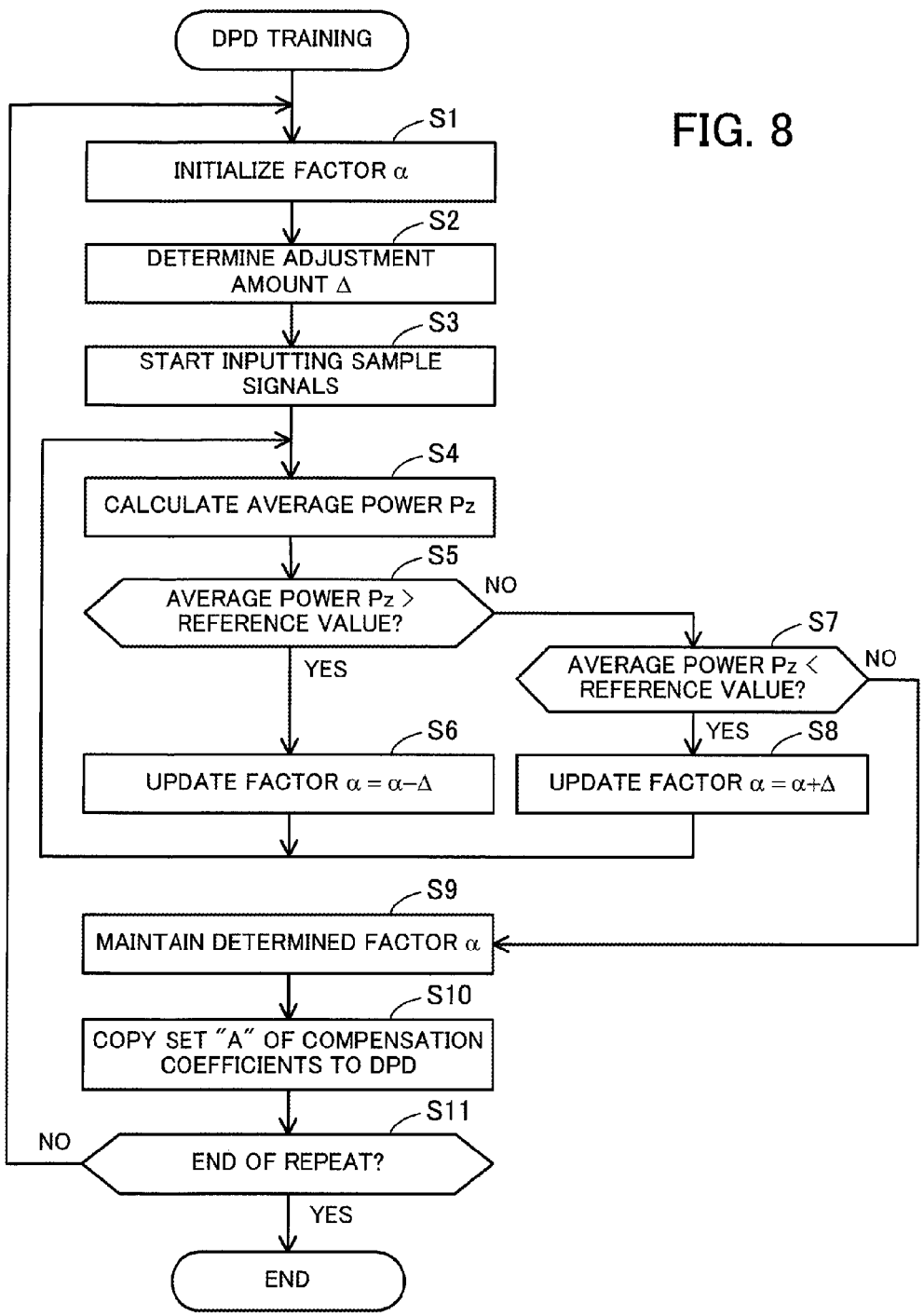
FIG. 8 is a flowchart illustrating an exemplary procedure of DPD training.

FIG. 8 is a flowchart illustrating an exemplary procedure of DPD training.

(S1) The AGC 113 initializes the factor α (for example, sets the factor α=1).

(S2) The AGC 113 determines an adjustment amount Δ to be applied each time when updating the factor α. The adjustment amount Δ may be fixed in advance, or may be a certain percentage of the factor α. For example, the AGC 113 determines the adjustment amount Δ=0.001·α.

(S3) The radio transmitting apparatus 100 starts inputting the signals x(n) to the AGC 113 as sample signals. The sample signals are randomly generated signals corresponding to a duration of one radio frame, for example. In steps S4 through S9, the learning using the sample signals progresses.

More specifically, in parallel with the adjustment of the factor α, the input signal x(n) is multiplied by the factor α by the AGC 113. The DPD 121 applies a compensation coefficient to a signal α·x(n) output from the AGC 113. A signal z(n) output from the DPD 121 is converted into an analog signal by the DAC 122. The converted analog signal z(n) is amplified by the power amplifier 123. A signal y(n) output from the power amplifier 123 is attenuated by the attenuator 124. A signal y(n)/G output from the attenuator 124 is converted into a digital signal by the ADC 125. The training DPD 126 applies a compensation coefficient to the converted digital signal y(n)/G, and updates a set A of compensation coefficients so as to reduce an error ε between a signal $\hat{z}$(n) and the signal z(n) output from the DPD 121.

(S4) The average power calculator 112 calculates, as a moving average, an average power Pz of the latest M signals z(n) output from the DPD 121.

(S5) The AGC 113 compares the average power Pz with the reference average power Pav, and determines whether the average power Pz is sufficiently greater than the reference average power Pav. For example, the AGC 113 determines whether Pz−Pav is greater than the threshold Th. If this condition is satisfied, the process proceeds to step S6. If this condition is not satisfied, the process proceeds to step S7.

(S6) The AGC 113 reduces the factor α by the adjustment amount Δ (α=α−Δ). Then, after the learning using the sample signals progresses, the process moves to step S4.

(S7) The AGC 113 compares the average power Pz with the reference average power Pav, and determines whether the average power Pz is sufficiently less than the reference average power Pav. For example, the AGC 113 determines whether Pz−Pav is less than −Th. If this condition is satisfied, the process proceeds to step S8. If this condition is not satisfied, the process proceeds to step S9.

(S8) The AGC 113 increases the factor α by the adjustment amount Δ (α=α+Δ). Then, after the learning using the sample signals progresses, the process moves to step S4. Note that the average power calculator 112 may update the average power Pz each time a signal z(n) corresponding to one sample signal is output from the DPD 121, or may intermittently update the average power Pz at a constant cycle time. Further, the AGC 113 may update the factor α each time a sample signal is processed, or may intermittently update the factor α at a constant cycle time.

(S9) The AGC 113 detects that the average power Pz is sufficiently close to the reference average power Pav. For example, the AGC 113 detects that the average power Pz and the reference average power Pav satisfy the condition −Th≤Pz−Pav≤Th. Then, the AGC 113 determines the current factor α for the current learning operation. In the subsequent process in the current learning operation, each signal x(n) input to the AGC 113 is multiplied by the determined factor α.

(S10) The training DPD 126 copies the set A of compensation coefficients that is updated during steps S4 through S9 to the DPD 121. Thus, one learning operation is completed.

(S11) The radio transmitting apparatus 100 determines whether to stop repeating the learning of the set A of compensation coefficients, that is, whether to end the training of the DPD 121. The number of learning operations may be fixed in advance, or may be dynamically determined according to the convergence status of the set A of compensation coefficients. In the case of performing another operation of learning the set A of compensation coefficients, the process moves to step S1. Otherwise, the training of the DPD 121 ends. In the second and subsequent learning operations, a tentative factor α used by the AGC 113 at the beginning of each learning operation may be the same initial value (for example, factor α=1) as that used in the first learning operation, or may be the factor α that is determined in the previous learning operation.

Next, a description will be given of effects of gain control by the AGC 113.

Figure 9:
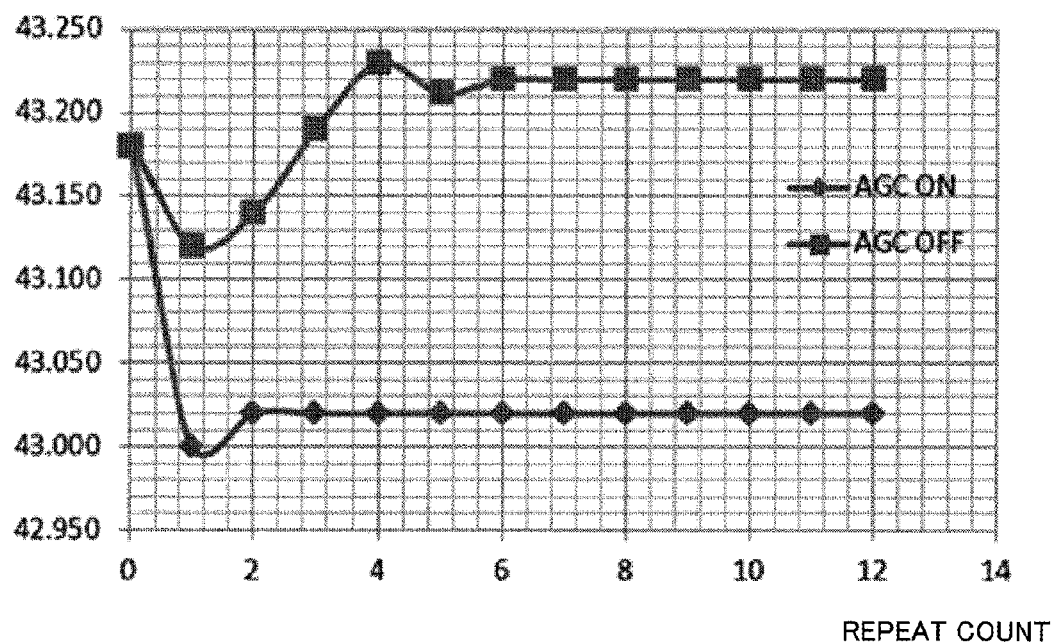
FIG. 9 is a graph illustrating an exemplary variation in the average output power of the power amplifier.

FIG. 9 is a graph illustrating exemplary variation in the average output power of the power amplifier 123.

This graph illustrates an exemplary variation in the average power (average output power) of the signals y(n) output from the power amplifier 123 when the learning of the set A of compensation coefficients is repeated.

In the example of FIG. 9, in the case where gain control is not performed by the AGC 113 (AGC_OFF), the average output power does not become stable but varies until the sixth learning operation. The reason why the convergence of the average output power is delayed is because a loop occurs in which the amplification characteristic of the power amplifier 123 changes in response to the update of the set A of compensation coefficients; the error ε is increased in response to the change in the amplification characteristic; and the set A of compensation coefficients is significantly updated. Especially, in the first half before convergence of the average output power, there is a loop in which the average output power is increased in response to the update of the set A of compensation coefficients; the set A of compensation coefficients is updated in response to the increased average output power; and the average output power is increased again. In the second half, the average output power fluctuates (rises, falls, and rises).

On the other hand, in the example of FIG. 9, in the case where gain control is performed by the AGC 113 (AGC_ON), the average power output becomes stable after the second learning operation. The average output power converges quickly due to the small variation in the average power (average input power) of the signals z(n) input to the power amplifier 123. The AGC 113 performs gain control on sample signals so as to prevent the average input power from changing, and thus to prevent the amplification characteristic of the power amplifier 123 from changing.

Figure 10:
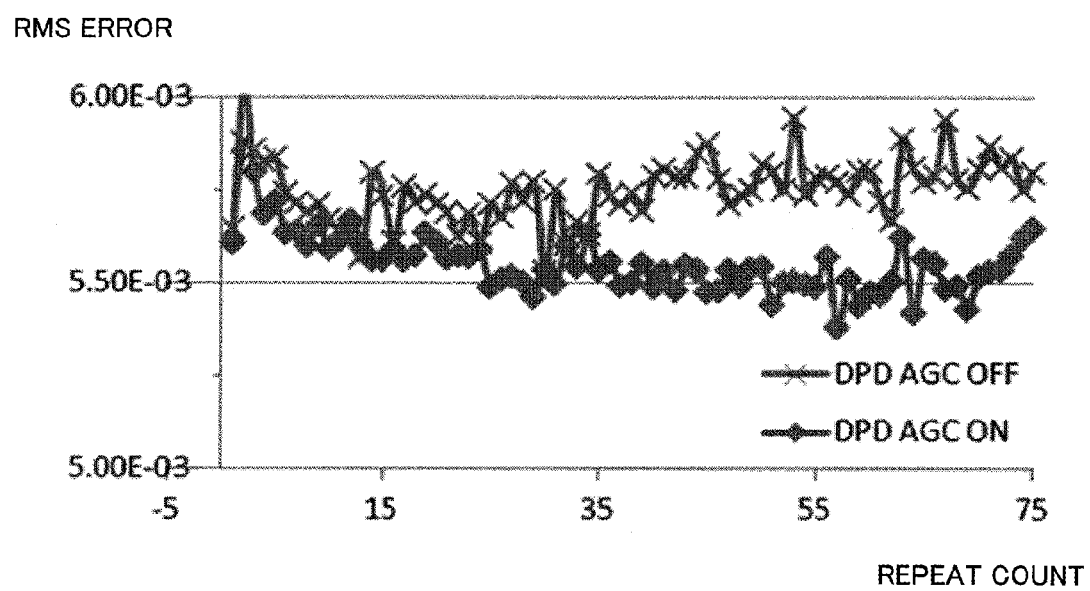
FIG. 10 is a graph illustrating exemplary variation in the linearization error.

FIG. 10 is a graph illustrating exemplary variation in the linearization error.

This graph illustrates an exemplary variation in the root mean square (RMS) calculated by the training DPD 126 when the learning of the set A of compensation coefficients is repeated. The RMS error indicates the difference between the signal z(n) that is obtained by applying the compensation coefficient and is to be amplified and the signal z^(n) that is obtained by applying the compensation coefficient to a feedback signal from the power amplifier 123.

In the example of FIG. 10, the RMS error is less in the case where gain control is performed by the AGC 113 (AGC_ON) than in the case where gain control is not performed by the AGC (AGC_OFF). In particular, after the 35th learning operation, the RMS error is much less in the case of AGC_ON than in the case of AGC_OFF. The reason why the RMS error is reduced is because the amplification characteristic of the power amplifier 123 is prevented from changing. Thus, the update amount of the set A of compensation coefficients is reduced, so that the set A of compensation coefficients converges more quickly.

Further, the RMS error at the end of the training is also less in the case of AGC_ON than in the case of AGC_OFF. Therefore, the set A of compensation coefficients that is finally determined by the training is closer to the ideal one in the case where the training is performed with AGC_ON than in the case where the training is performed with AGC_OFF. Accordingly, when the AGC 113 performs gain control during the training, the accuracy in the distortion compensation by the DPD 121 is improved.

Figure 11A:
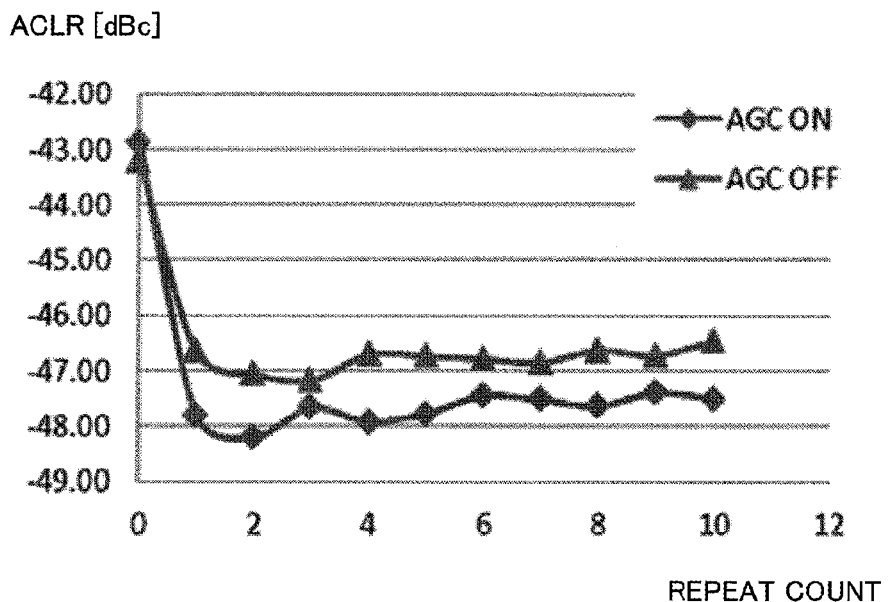
FIGS. 11A and 11B are graphs each illustrating exemplary variation in the adjacent channel leakage power.
Figure 11B:
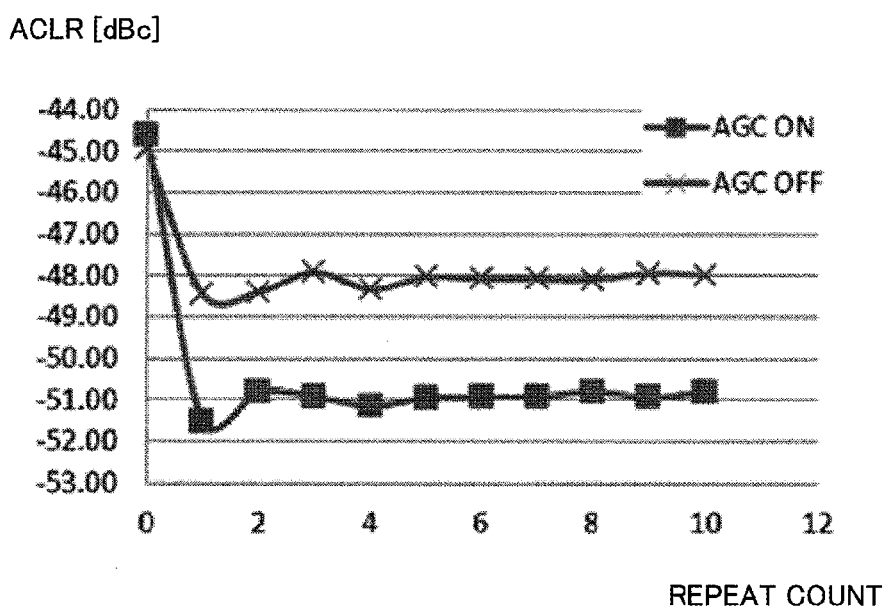

FIGS. 11A and 11B are graphs each illustrating exemplary variation in the adjacent channel leakage power.

Each graph illustrates exemplary variation in the adjacent channel leakage ratio (ACLR) of the signal y(n) output from the power amplifier 123 in the case where the learning of the set A of compensation coefficients is repeated. The ACLR is a ratio of the power leaked to the adjacent frequency channels with respect to the power of the desired frequency channel through which transmission is permitted. In this example, the adjacent frequency channels include an adjacent channel at 5 MHz offset below and an adjacent channel at 5 MHz offset above the desired frequency channel.

The greater the non-linear distortion generated upon amplification of a transmission signal by the power amplifier 123 is, the greater the power leaked to the adjacent frequency channels is. In the examples of FIGS. 11A and 11B, in both the adjacent channels at 5 MHz offset above and at 5 MHz below the desired frequency channel, the ACLR is less in the case where gain control is performed by the AGC 113 (AGC_ON) than in the case where gain control is not performed (AGC_OFF). This indicates that, in the case where the training is performed with AGC_ON, the calculated set of compensation coefficients is closer to the ideal one, and that the compensation accuracy of the amplification characteristic of the power amplifier 123 is higher (i.e., the amplification characteristic is more linear).

Next, modified examples of the distortion compensation method will be described.

Figure 12:
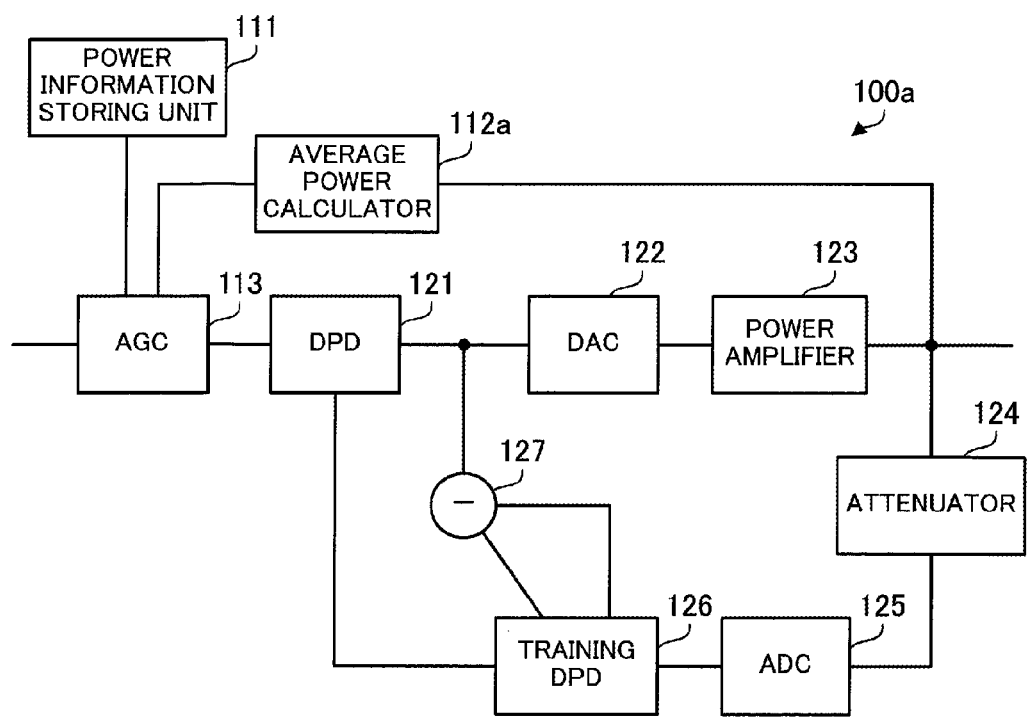
FIG. 12 is a block diagram illustrating a radio transmitting apparatus according to a first modified example.

FIG. 12 is a block diagram illustrating a radio transmitting apparatus 100a according to a first modified example.

The radio transmitting apparatus 100a according to the first modified example differs from the radio transmitting apparatus 100 of FIG. 3 in the method of calculating the average power Pz. The radio transmitting apparatus 100a includes an average power calculator 112a in place of the average power calculator 112. The average power calculator 112a obtains a signal y(n) output from a power amplifier 123, in place of a signal z(n) output from a DPD 121. Then, the average power calculator 112a calculates, as a moving average, an average power Pz of the latest M signals y(n). In this way, the gain of an AGC 113 may be controlled on the basis of the average power of amplified signals, in place of the average power of signals before amplification. Note that a reference average power Pav used herein is that for amplified signals.

Figure 13:
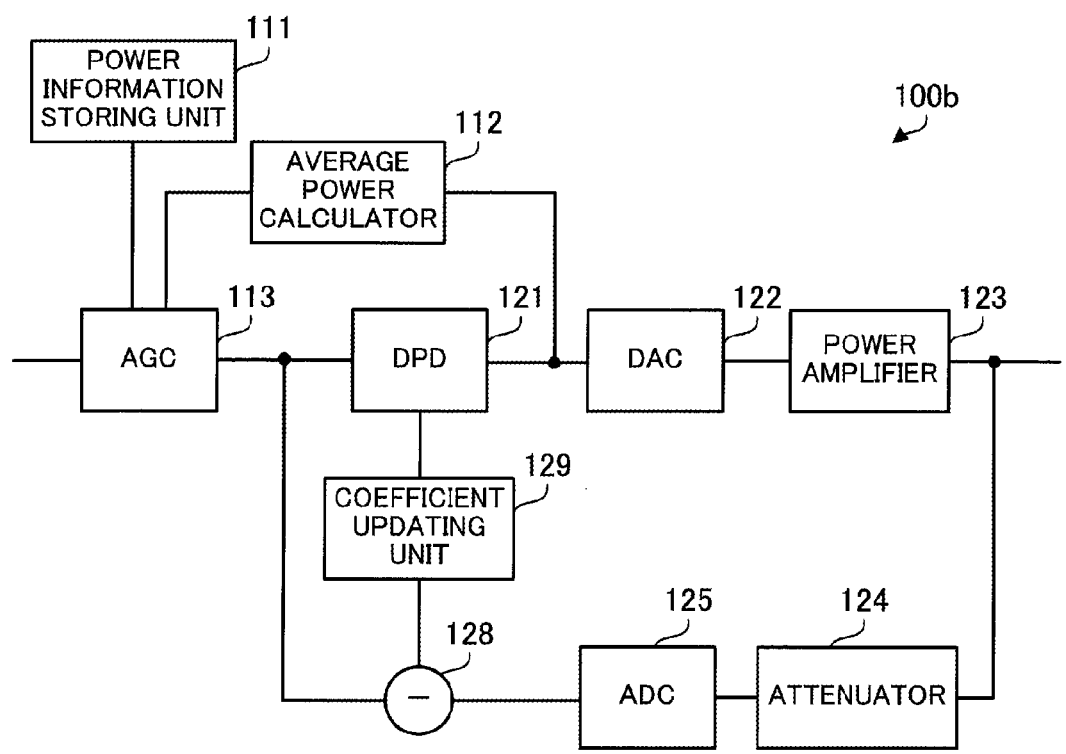
FIG. 13 is a block diagram illustrating a radio transmitting apparatus according to a second modified example.

FIG. 13 is a block diagram illustrating a radio transmitting apparatus 100b according to a second modified example.

The radio transmitting apparatus 100b according to the second modified example differs from the radio transmitting apparatus 100 of FIG. 3 in the architecture of learning a set A of compensation coefficients. More specifically, while the radio transmitting apparatus 100 performs training of the DPD 121 using an indirect learning architecture, the radio transmitting apparatus 100b performs training of a DPD 121 using a direct learning architecture.

The radio transmitting apparatus 100b includes a subtractor 128 and a coefficient updating unit 129, in place of the training DPD 126 and the subtractor 127. The subtractor 128 compares a signal before input to the DPD 121 and a feedback signal obtained from an ADC 125, and calculates the difference between the two signals. The coefficient updating unit 129 updates a set A of compensation coefficients on the basis of the calculated difference. In this way, gain control using the AGC 113 may be applied to the direct learning architecture, as well as the indirect learning architecture.

According to the radio communication system of the second embodiment, during the training in which the set A of compensation coefficients is iteratively updated, the gain of signals before input to the DPD 121 is controlled. Thus, even when the set A of compensation coefficients used by the DPD 121 is updated, it is possible to prevent the average power of signals input to the power amplifier 123 from being greatly changed from the average power before the update. Therefore, it is possible to prevent the amplification characteristic of the power amplifier from changing with changes in the driving conditions of the power amplifier 123 before and after update of the set A of compensation coefficients. Thus, it is possible to stably learn the set A of compensation coefficients. As a result, the set A of compensation coefficients converges more quickly, and therefore the training time may be reduced. Further, the error detected during the training is reduced, and therefore the accuracy of the finally determined set A of compensation coefficients is increased. Accordingly, it is possible to achieve an improved radio communication quality in the radio communication system, such as reduced power leakage to the adjacent channels and the like.

According to one aspect, a compensation coefficient of a pre-distorter converges more quickly.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A distortion compensation apparatus that compensates for non-linear distortion of a power amplifier, the distortion compensation apparatus comprising:

a pre-distorter configured to apply distortion to a signal before input to the power amplifier, in accordance with a compensation coefficient;

a learning unit configured to repeatedly update the compensation coefficient on the basis of signals output from the power amplifier, during training of the pre-distorter; and a gain control unit configured to calculate an average power of signals after application of distortion by the pre-distorter, and to perform gain control on a signal before input to the power amplifier in accordance with the average power, while the training continues after update of the compensation coefficient.

2. The distortion compensation apparatus according to claim 1, wherein the gain control unit reduces gain when the average power is increased by the update of the compensation coefficient, and increases the gain when the average power is reduced by the update of the compensation coefficient.

3. The distortion compensation apparatus according to claim 1, wherein the gain control unit performs the gain control such that the average power approaches a predetermined value.

4. The distortion compensation apparatus according to claim 1, wherein the gain control unit calculates the average power of signals after application of distortion by the pre-distorter but before input to the power amplifier.

5. The distortion compensation apparatus according to claim 1, wherein the gain control unit performs the gain control on a signal before input to the pre-distorter.

6. A distortion compensation method that compensates for non-linear distortion of a power amplifier by using a pre-distorter, the method comprising:

updating a compensation coefficient used by the pre-distorter on the basis of a signal output from the power amplifier, during training of the pre-distorter;

calculating an average power of signals after application of distortion by the pre-distorter; and performing gain control on a signal before input to the power amplifier in accordance with the average power, while the training continues after update of the compensation coefficient.

* * * * *